United States Patent [19]

Chang et al.

[11] Patent Number: 5,393,697
[45] Date of Patent: Feb. 28, 1995

[54] COMPOSITE BUMP STRUCTURE AND METHODS OF FABRICATION

[75] Inventors: Shyh-Ming Chang, Hsinchu; Yu-Chi Lee, Taipei Hsien; Hsiu-Mei Yu; Li-Hui Yang, both of Hsinchu Hsien; Jwo-huei Jou, Hsinchu, all of Taiwan, Prov. of China

[73] Assignee: Industrial Technology Research Institute, Hsinchu, Taiwan, Prov. of China

[21] Appl. No.: 239,424

[22] Filed: May 6, 1994

[51] Int. Cl.⁶ ............................................. H01L 21/44
[52] U.S. Cl. .................................. 437/183; 437/189; 437/190; 437/192; 437/203
[58] Field of Search ............... 437/183, 184, 182, 192, 437/193, 203, 189, 190; 257/759

[56] References Cited

U.S. PATENT DOCUMENTS

| | | | |
|---|---|---|---|
| 3,401,126 | 9/1968 | Miller et al. | 252/514 |
| 3,809,625 | 5/1974 | Brown et al. | 204/15 |
| 4,749,120 | 6/1988 | Hatada | 228/123 |
| 4,916,523 | 4/1990 | Sokolovsky et al. | 357/74 |
| 4,963,002 | 10/1990 | Tagusa et al. | 350/336 |
| 5,071,787 | 12/1991 | Mori et al. | 437/183 |
| 5,134,460 | 7/1992 | Brady et al. | 357/71 |
| 5,138,424 | 8/1992 | Moss et al. | 257/759 |
| 5,155,576 | 10/1992 | Mizushima | 257/759 |
| 5,208,186 | 5/1993 | Mathew | 437/183 |
| 5,223,454 | 6/1993 | Uda et al. | 437/189 |
| 5,284,797 | 2/1994 | Heim | 437/203 |
| 5,290,732 | 3/1994 | Kumar et al. | 437/183 |

FOREIGN PATENT DOCUMENTS

| | | | |
|---|---|---|---|
| 60-121740 | 6/1985 | Japan | 257/759 |
| 5182972 | 7/1993 | Japan | 437/183 |

OTHER PUBLICATIONS

Satou et al, *Polymers for Electronic and Photonic Applications*, AT&T Bell Laboratories, Academic Press, Inc., New York, New York, 1993 pp. 221–247.
Research Disclosure, "Polymeric Vias with Nitride Sidewall Structure for Improved Tungsten Fill," Aug. 1990, No. 316.

*Primary Examiner*—Brian E. Hearn
*Assistant Examiner*—Kevin M. Picardat
*Attorney, Agent, or Firm*—George O. Saile

[57] ABSTRACT

A composite bump structure and methods of forming the composite bump structure. The composite bump structure comprises a polymer body of relatively low Young's Modulus compared to metals covered by a conductive metal coating formed at the input/output pads of an integrated circuit element or substrate. The composite bump is formed using material deposition, lithography, and etching techniques. A layer of soldering metal can be formed on the composite bumps if this is desired for subsequent processing.

22 Claims, 17 Drawing Sheets

COMPOSITE BUMP STRUCTURE AND METHODS OF FABRICATION

BACKGROUND OF THE INVENTION

(1) FIELD OF THE INVENTION

The invention relates to the joining of integrated circuit elements to the next level of integration and more particularly to the formation of the bonded structure which comprises the physical and electrical connection between the integrated circuit element and the next level of integration.

(2) DESCRIPTION OF THE RELATED ART

In the manufacture of highly dense integrated circuits the formation of an inexpensive and highly reliable mechanical bond and electrical interconnection has long been recognized to be of key importance. Some time ago a solution to this need was patented by L. F. Miller et al in U.S. Pat. No. 3,401,126. This method worked well for many years but increasing levels of integration and circuit density have made the need for interconnections on an increasingly fine pitch of key importance.

A method for achieving increased interconnection density was patented by K. Hatada in U.S. Pat. No. 4,749,120. This method employs a gold bump as the electrical interconnection between the IC circuit chip and the substrate while holding the IC chip in place with a resin coating on the substrate acting as an adhesive between chip and substrate. This method has the disadvantage of a relatively high Young's Modulus for metal. As a result of the high Young's Modulus a very large bonding force is required between the IC chip and the substrate during the bonding process while the resin is undergoing its curing cycle. After the bonding process the gold bump will tend to return to its original shape and the recoil forces will disengage some of the bumps from the electrodes on the substrate. Another method patented by Y. Tagusa et al in U.S. Pat. No. 4,963,002 employs nickel plated plastic beads or silver particles to achieve the electrical connection, but the former suffers from small contact area and the latter has the disadvantage of the relatively high Young's Modulus for silver.

U.S. Pat. No. 4,916,523 issued to Sokolovsky et al shows a unidirectional conductive adhesive to bond the integrated circuit to the substrate. U.S. Pat. No. 5,134,460 issued to Brady et al shows conductive metal bumps coated with a gold layer.

SUMMARY OF THE INVENTION

It is the principal object of this invention to provide a composite bump which can be formed on an integrated circuit element, on the substrate to which the integrated circuit element is connected, or on both the integrated circuit element and the substrate. The composite bumps are comprised of a single polymer body with a Young's Modulus which is low compared to metals and a conductive metal coating covering the polymer body. The conductive metal coating covering the polymer body must be chosen to provide good adhesion to the polymer body and may include an adhesive layer and a barrier layer in addition to a conductor layer. The composite bump forms part of the physical and electrical bond between the integrated circuit element and the substrate. The low Young's Modulus of the polymer, between about $0.4 \times 10^6$ and $0.5 \times 10^6$ psi, allows the bond to be made with very low bonding force, greatly reduces or eliminates the force tending to separate the connections after bonding, and results in extremely reliable physical and electrical connections between the integrated circuit element and substrate.

A further objective of the invention is to provide methods of fabrication of the composite bump on either an integrated circuit element or a substrate to which an integrated circuit element can be connected. This objective is achieved by depositing a layer of polymer on the surface of an integrated circuit element or substrate. Using photolithographic techniques the polymer is removed everywhere except at the location of the integrated circuit element or substrate input/output pads. Metal is then deposited over the surface of the integrated circuit element or substrate. Using photolithographic techniques the metal is removed everywhere except at the location of the integrated circuit element or substrate input/output pads and the composite bumps are formed. The resulting composite bumps have a single polymer body with a low Young's Modulus relative to metals and a conductive metal coating covering the polymer body. In some instances a metal layer can be formed on the input/output pads and under the polymer body. This metal layer reduces the sheet resistance of the input/output pads. The polymer body must be chosen to withstand the temperatures of subsequent processing such as bonding. The polymer body must also be chosen so that it can be etched during fabrication of the composite bump. Polyamic acid polyimide fulfills these requirements. The conductive metal coating covering the polymer body must be chosen to provide good adhesion to the polymer body and may include an adhesive layer and a barrier layer in addition to a conductor layer.

DESCRIPTION OF THE PREFERRED EMBODIMENTS

Figure 1A:
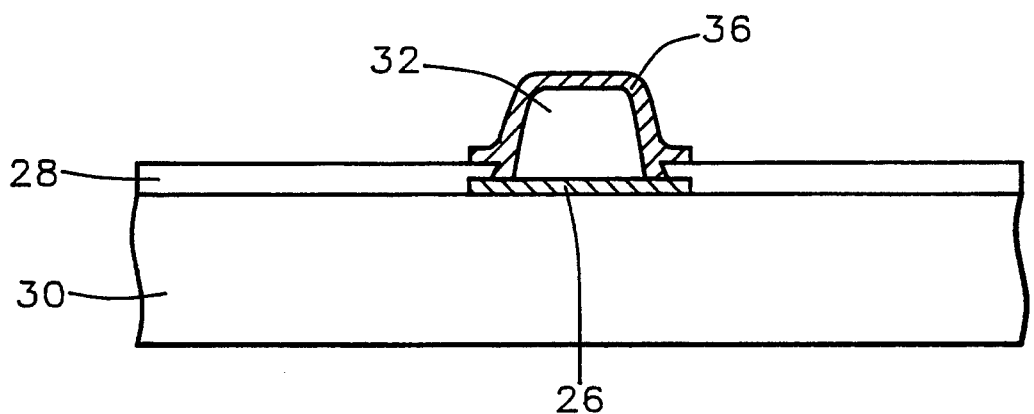
FIG. 1A shows a cross sectional view of a composite bump formed on an integrated circuit element or substrate.

FIG. 1A shows an embodiment of the composite bump formed on either an integrated circuit element or on a substrate. A passivation layer 28 and an aluminum input/output pad 26 of about 90 microns diameter is formed on an integrated circuit element or substrate 30. A polymer body 32 with a thickness of between about 5 microns and 25 microns is formed on the input/output pad 26. The polymer body can be polyamic acid polyimide such as PROBIMIDE 7010 or PROBIMIDE 514 produced by OCG Microelectronic Materials, Inc., Tempe, Ariz.

Figure 1B:
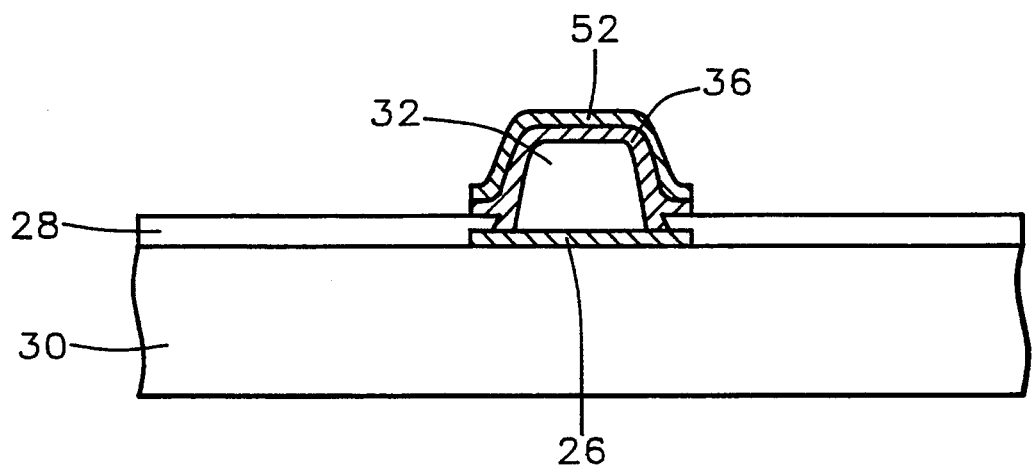
FIG. 1B shows a cross sectional view of a composite bump formed on an integrated circuit element or substrate with a solder coating on the composite bump.

A conductive metal coating 36 is formed over the polymer body and must adhere to the polymer body. The coating can be a metal such as aluminum or nickel; or a composite such as nickel/gold, chrome/gold, chrome/silver, or titanium/platinum. The conductive metal coating 36 can be a composite which includes an adhesion layer/a barrier layer/ a conductor layer such as chrome/copper/gold, chrome/nickel/gold, chrome/silver/gold, titanium/platinum/gold, titanium/palladium/gold, or titanium/tungsten/silver. A solder coating, such as PbSn, InGa, or InSn may be formed over the conductive metal coating, shown in FIG. 1B, if this is desired for a soldering process. In this case the preferred conductive metal coatings are chrome/copper/gold, chrome/nickel/gold, chrome/silver/gold, titanium/platinum/gold, or titanium/palladium/gold.

Figure 2:
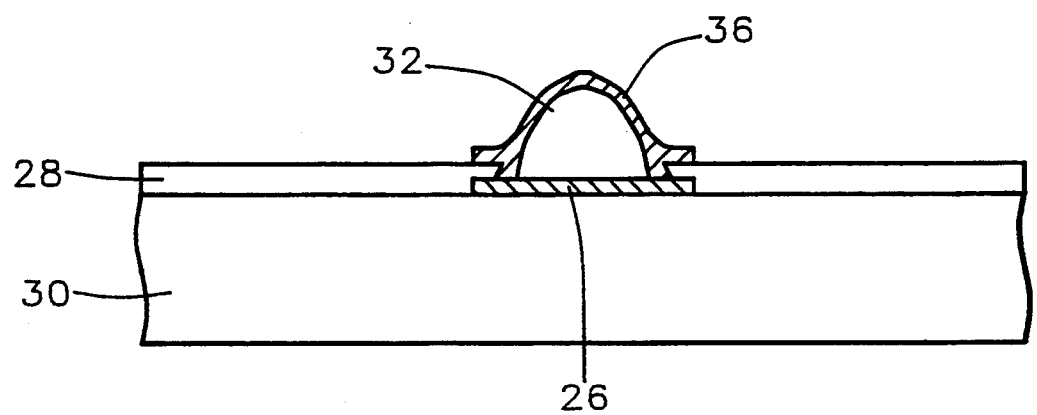
FIG. 2 shows a cross sectional view of a composite bump formed in a hemispherical shape on an integrated circuit, element or substrate.
Figure 3:
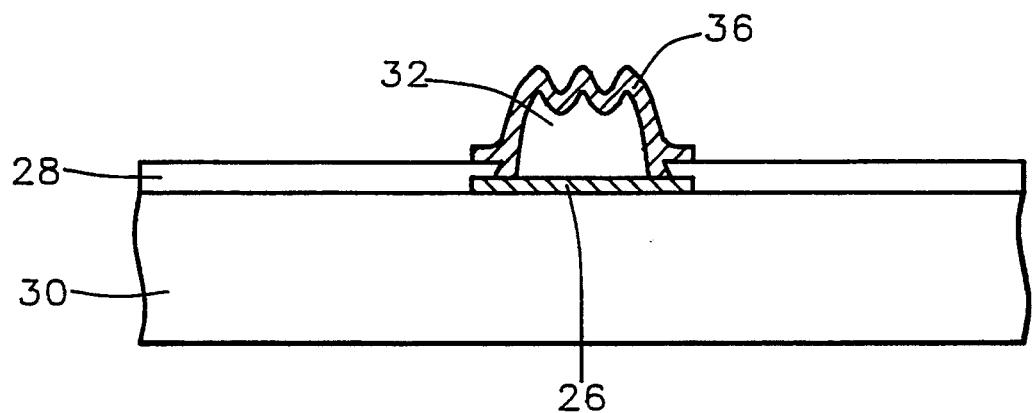
FIG. 3 shows a cross sectional view of a composite bump formed with a rough shape on an integrated circuit element or substrate.
Figure 4:
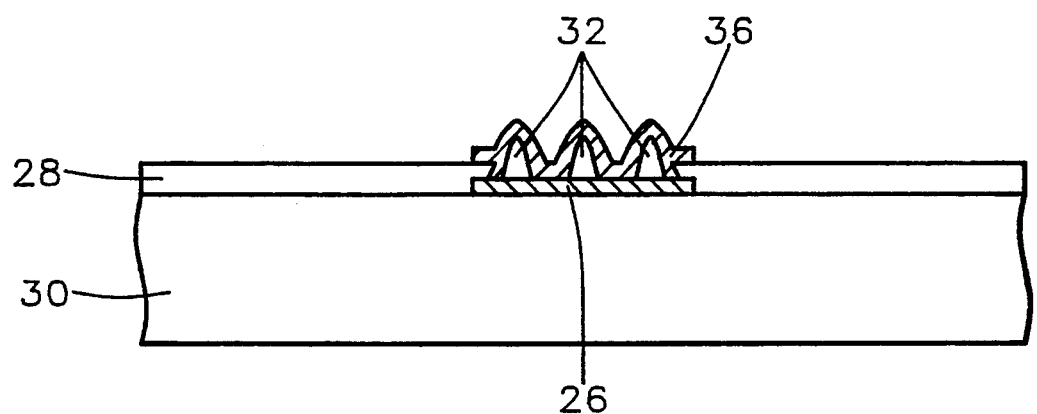
FIG. 4 shows a cross sectional view of composite bumps formed so there are multiple bumps within the input/output pattern of an integrated circuit element or substrate.
Figure 5:
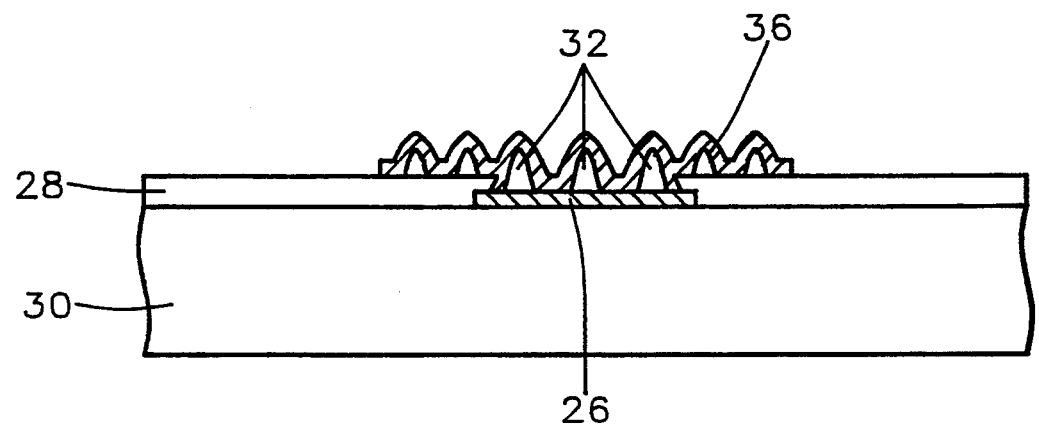
FIG. 5 shows a cross sectional view of composite bumps formed so there are multiple bumps within and extending beyond the input/output pattern of an integrated circuit element or substrate.
Figure 6:
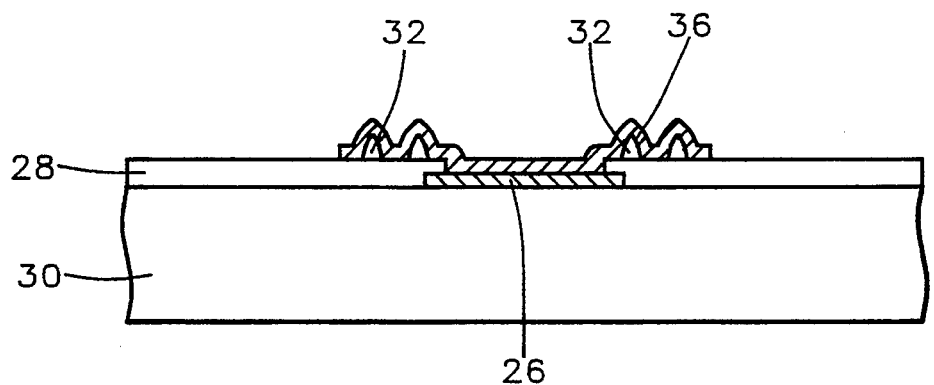
FIG. 6 shows a cross sectional view of composite bumps formed so there are multiple bumps forming a ring around the input/output pattern of an integrated circuit element or substrate.

Additional embodiments of the composite bump are shown in FIG. 2 through FIG. 6. FIG. 2 shows a composite bump formed in a hemispherical shape. FIG. 3 shows a composite bump formed with a rough surface on the bump. FIG. 4 shows multiple composite bumps formed inside the input/output pattern 26 of the integrated circuit element or substrate 30. FIG. 5 shows multiple composite bumps formed both inside and in a ring surrounding the input/output pattern 26 of the integrated circuit element or substrate 30. FIG. 6 shows multiple composite bumps formed in a ring surrounding the input/output pattern 26 of the integrated circuit element or substrate 30.

Figure 8A:
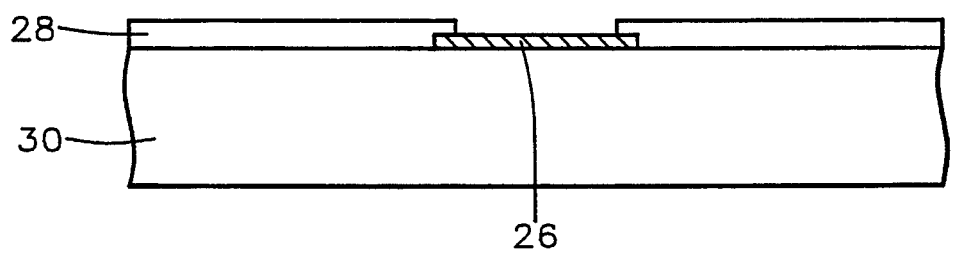
FIGS. 8A through 8J show cross sectional representations of the method for forming composite bumps with a base metal layer under the composite bump and on top of the input/output pad using photoresist for patterning the polymer and metal layers.
Figure 8B:
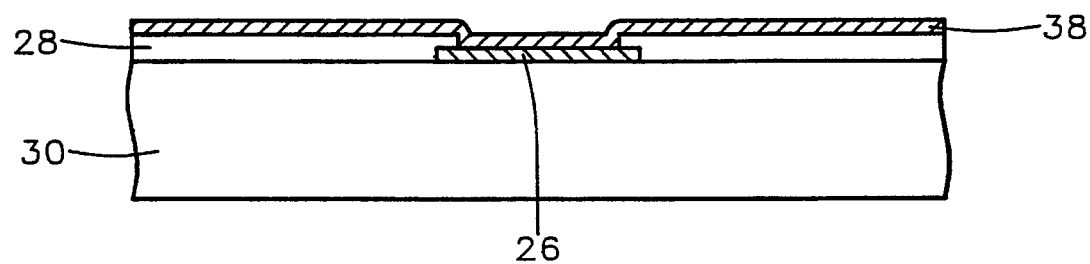
Figure 8C:
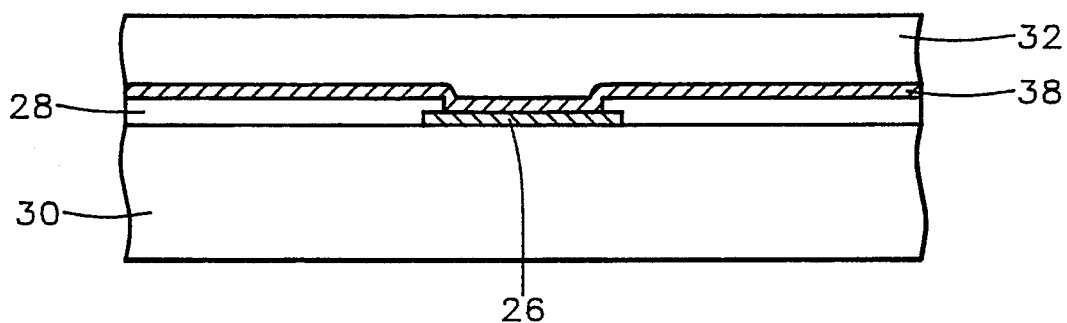
Figure 8D:
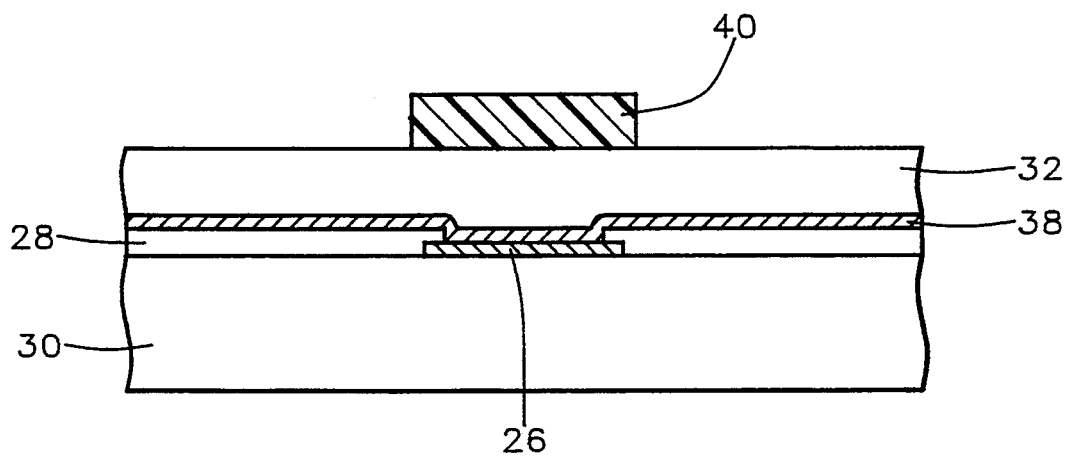
Figure 8E:
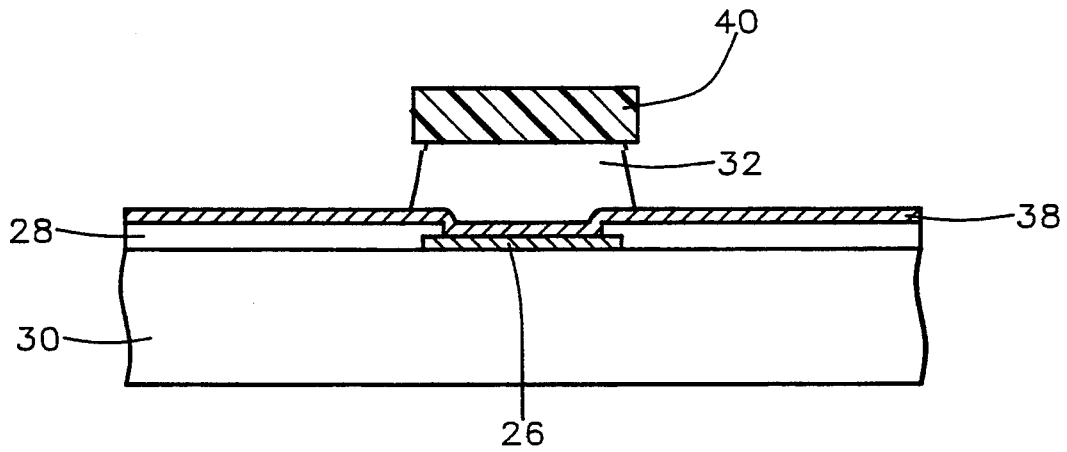
Figure 8F:
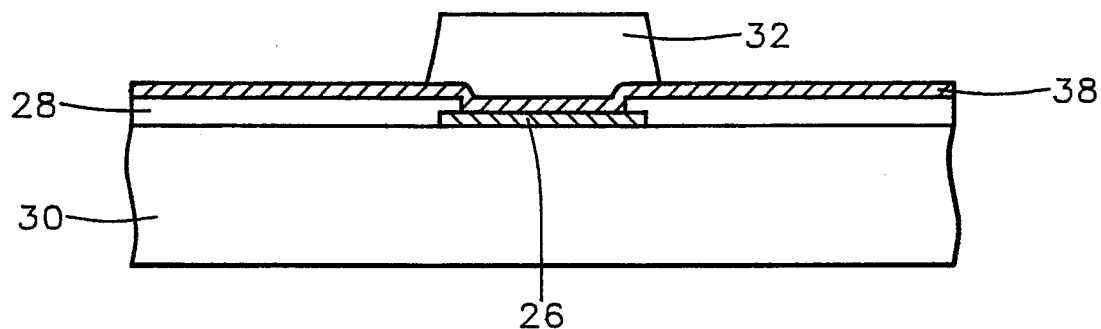
Figure 8G:
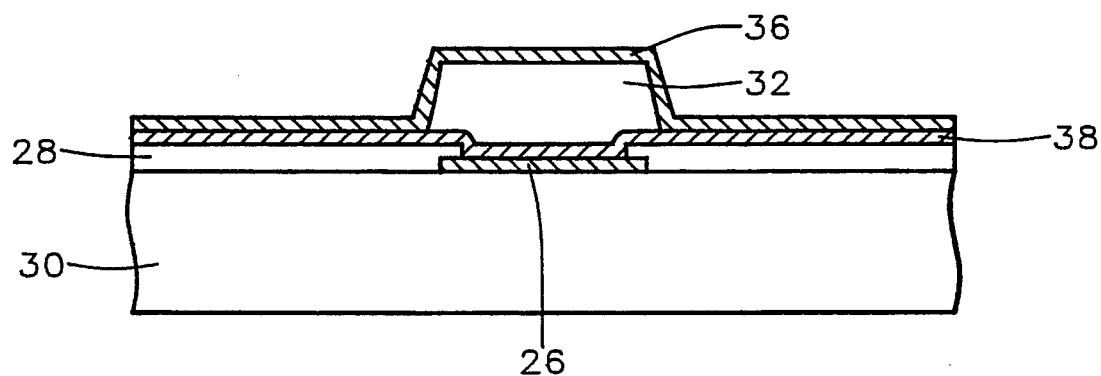
Figure 8H:
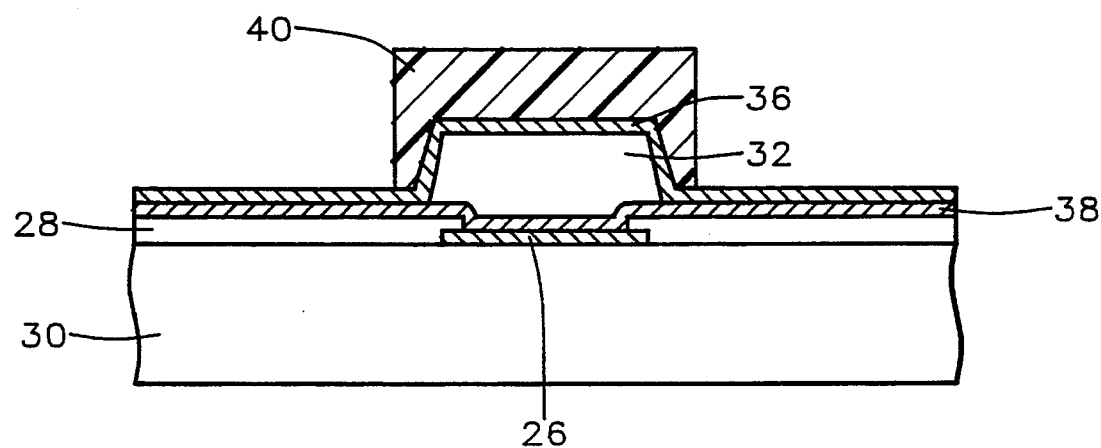
Figure 8I:
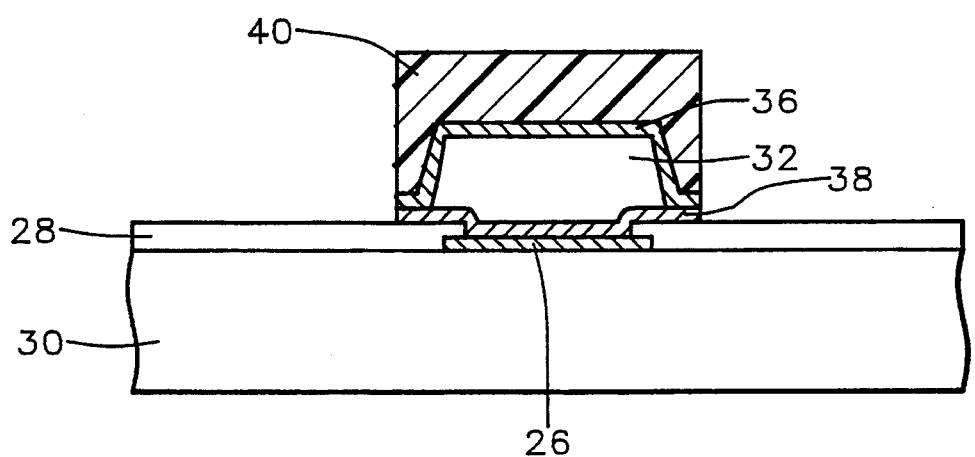
Figure 8J:
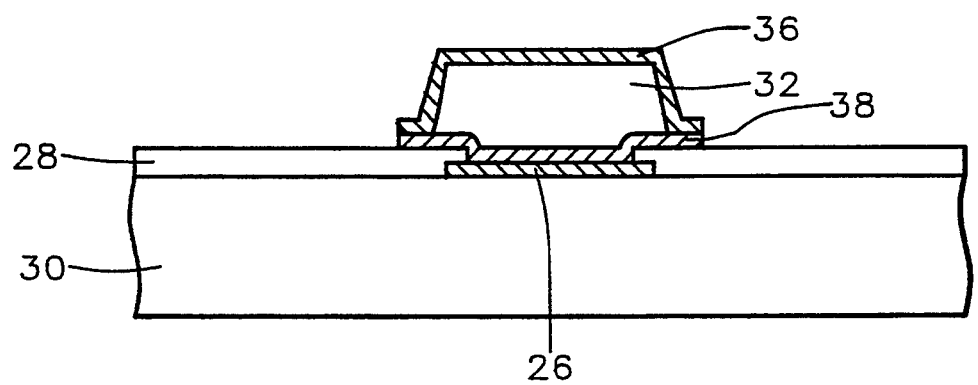

The above embodiments may also have a base metal layer of aluminum 38 formed under the polymer body 32 and on top of the input/output pad 26 as shown in FIG. 8J. This base metal layer extends over the edges of the passivation layer 28.

Figure 7A:
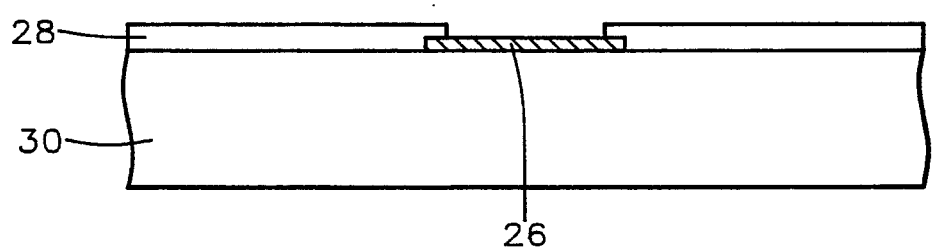
FIGS. 7A through 7I show cross sectional representations of the method for forming composite bumps using photoresist for patterning the polymer and metal layers.
Figure 7B:
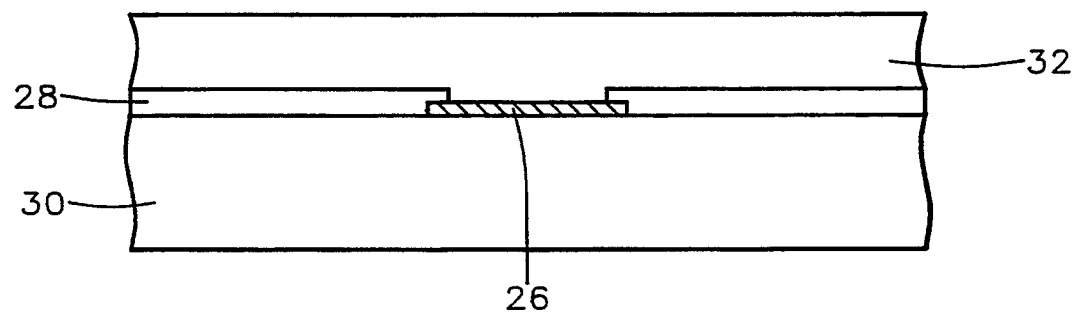
Figure 7C:
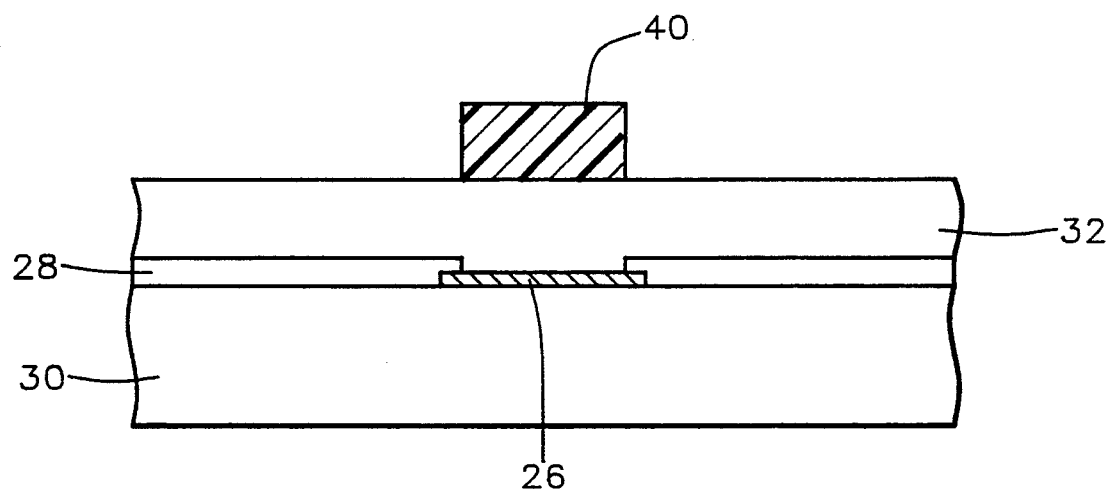
Figure 7D:
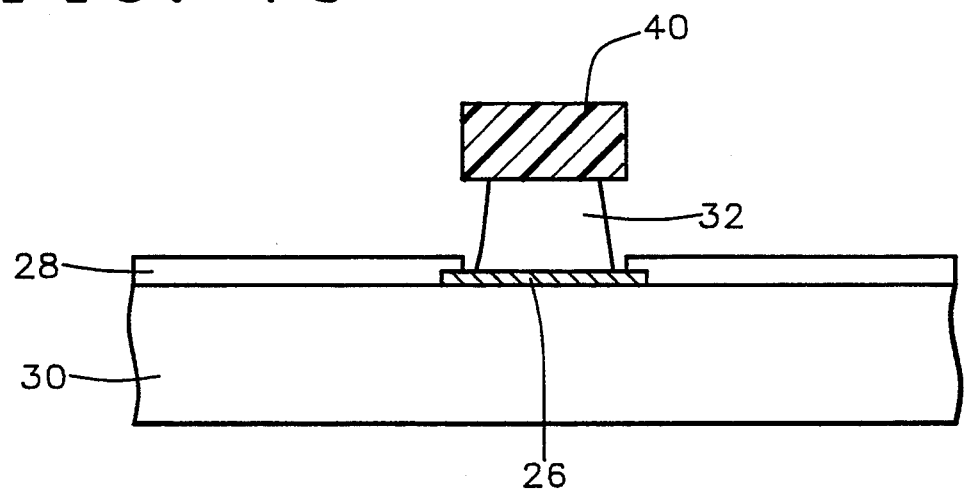
Figure 7E:
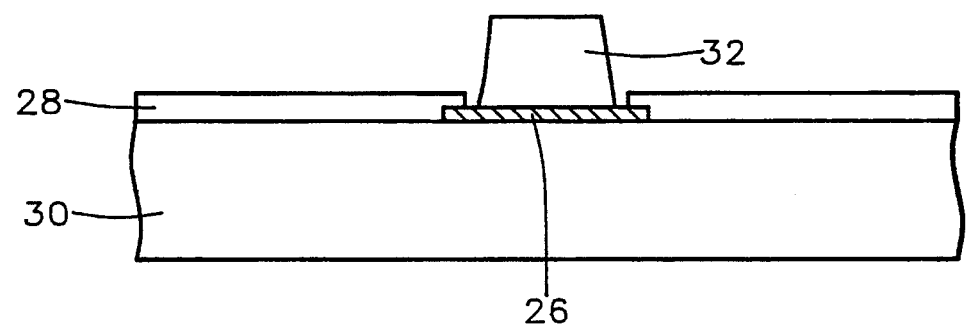
Figure 7F:
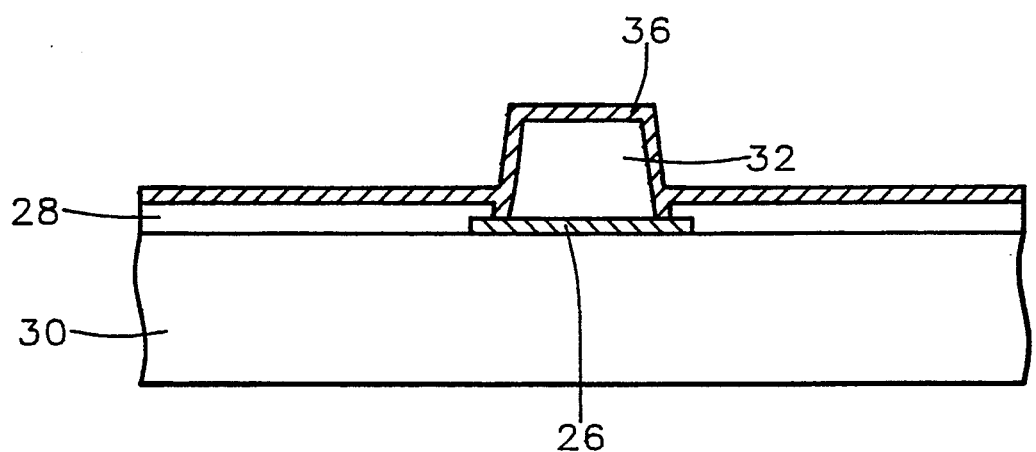

Refer now more particularly to FIGS. 7A through 7I. There is shown an embodiment of a method for forming the composite bump of the current invention. First the integrated circuit element or substrate 30 with a passivation layer 28 and aluminum input/output pads 26 with a diameter of about 90 microns is etched and cleaned, as shown in FIG. 7A. Next, as shown in FIG. 7B, a layer of non photosensitive polymer 32 such as a polyamic acid polyimide like PROBIMIDE 514 produced by OCG Microelectronic Materials, Inc., Tempe, Ariz. with a thickness of between about 5 and 25 microns is formed on the surface of the integrated circuit element or substrate 30. Next, as shown in FIG. 7C, a photoresist pattern 40 is formed on the polyamic acid polyimide. As shown in FIG. 7D, the polyamic acid polyimide is then etched to the photoresist pattern using MF-319 at room temperature for between about 1 and 3 minutes. Patterning of polyimide films is described in Chapter 8 of POLYIMIDES edited by Wilson, Stenzenberger, and Hergenrother published by Blackie & Son Ltd. in 1990. The photoresist is then stripped, FIG. 7E. As shown in FIG. 7F a conductive metal layer 36 such as a composite of chrome/gold with chrome about 500 Angstroms thick and gold about 2000 Angstroms thick is deposited on the integrated circuit element or substrate 30. The coating 36 can also be a metal such as aluminum or nickel; or a composite such as nickel/gold, chrome/silver, or titanium/platinum. The conductive metal coating 36 can also be a composite which includes an adhesion layer/a barrier layer/a conductor layer such as chrome/copper/gold, chrome/nickel/gold, chrome/silver/gold, titanium/platinum/gold, titanium/palladium/gold, or titanium/tungsten/silver.

Figure 7G:
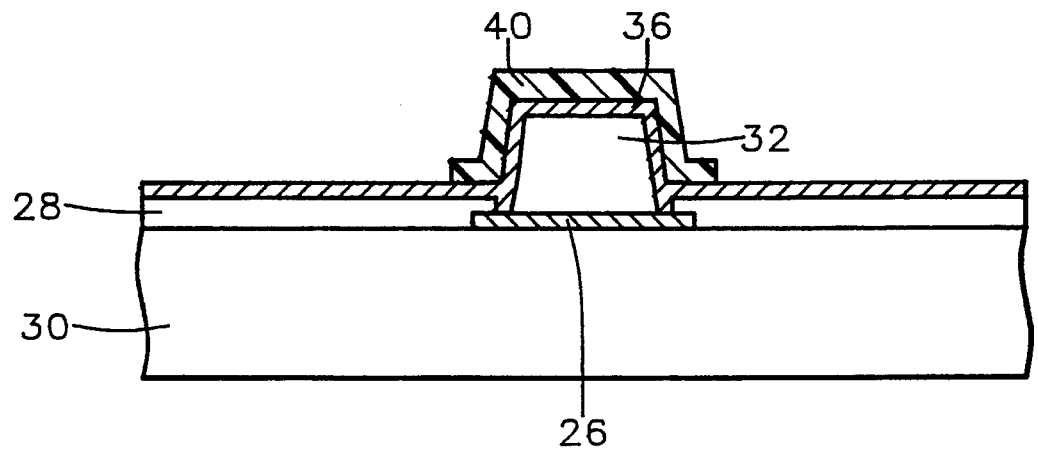
Figure 7H:
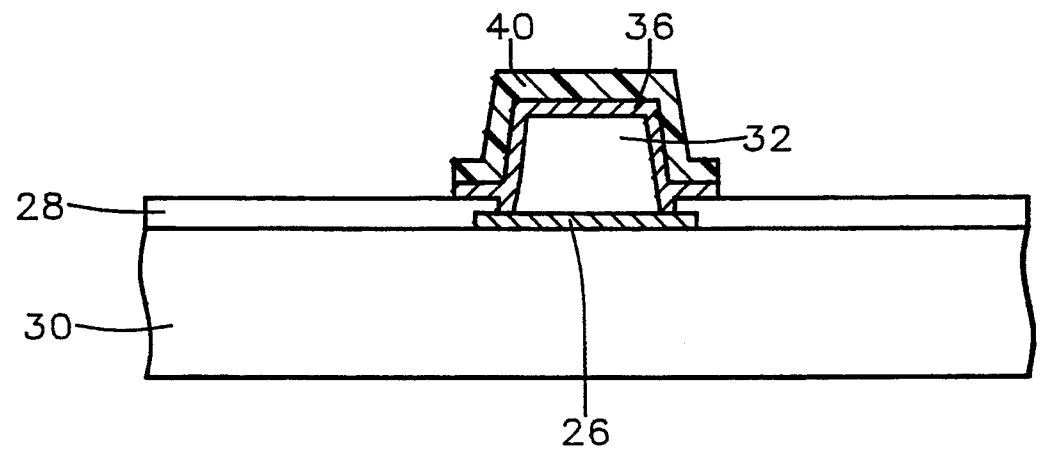
Figure 7I:
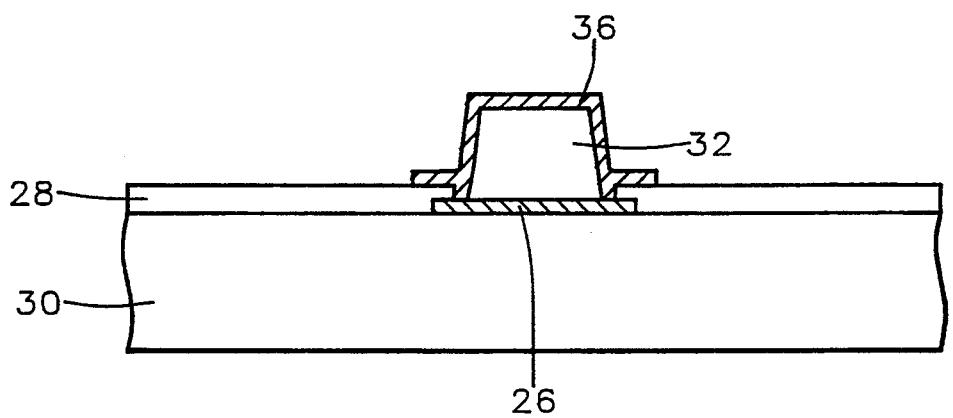

A patterned layer of photoresist 40, FIG. 7G, is then formed on the conductive metal layer 36 and the conductive metal layer is etched to the pattern of the photoresist 40, FIG. 7H. The photoresist is then stripped, FIG. 7I, and the composite bump is formed. For the chrome/gold conductive metal layer etching can be accomplished using 1 g $Ce(SO_4)_2*2(NH_4)_2SO_4*2$-$H_2O$+5 ml $HNO_3$+25 ml $H_2O$ at 28° C. to etch chrome at about 85 Angstroms/minute and 4 g KI+1 g $I_2$+40 ml $H_2O$ at room temperature to etch gold at between about 0.5 and 1.0 microns/minute.

Another embodiment method is shown in FIGS. 8A through 8J. The integrated circuit element or substrate 30 with a passivation layer 28 and aluminum input/output pads 26 with a diameter of about 90 microns is etched and cleaned, as shown in FIG. 8A. Next, as shown in FIG. 8B, a layer of metal 38 such as aluminum is deposited on the integrated circuit element or substrate 30. The method then proceeds as described in the immediately preceding embodiment beginning with the formation of the layer of polyamic acid polyimide 32 and continuing until the conductive metal coating 36 is etched, FIGS. 8C to 8I. The aluminum 38 is then etched using $H_3PO_4$:$CH_3COOH$:$HNO_3$:$H_2O$ (4:4:1:1) at room temperature at about 350 Angstroms/minute. As shown in FIG. 8J the photoresist is then stripped and the composite bump is formed.

Figure 9A:
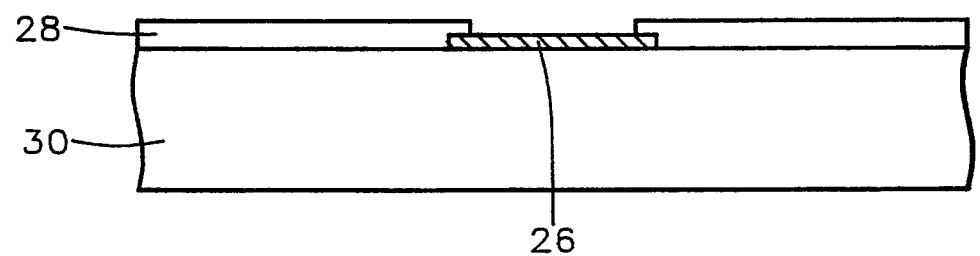
FIGS. 9A through 9G show cross sectional representations of the method for forming composite bumps using photosensitive polymer to pattern the polymer layer and photoresist to pattern the metal layer.
Figure 9B:
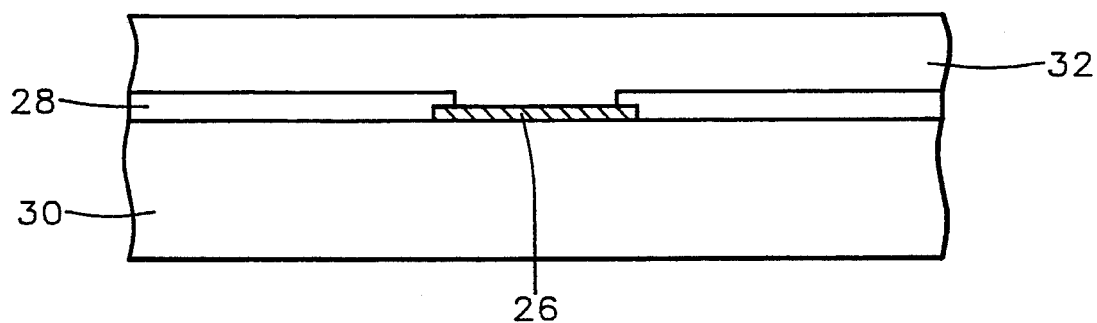
Figure 9C:
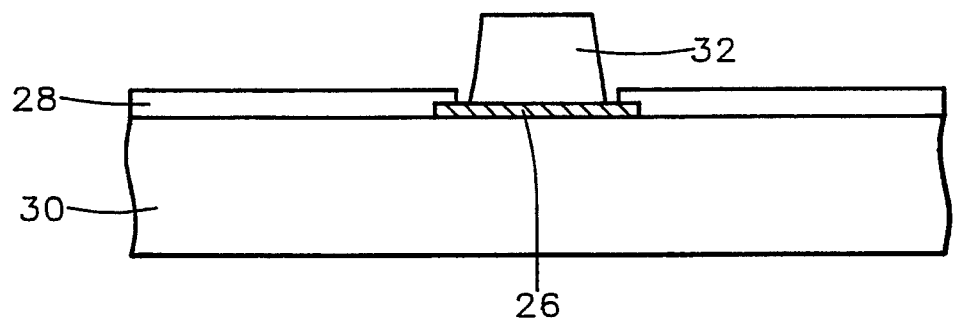
Figure 9D:
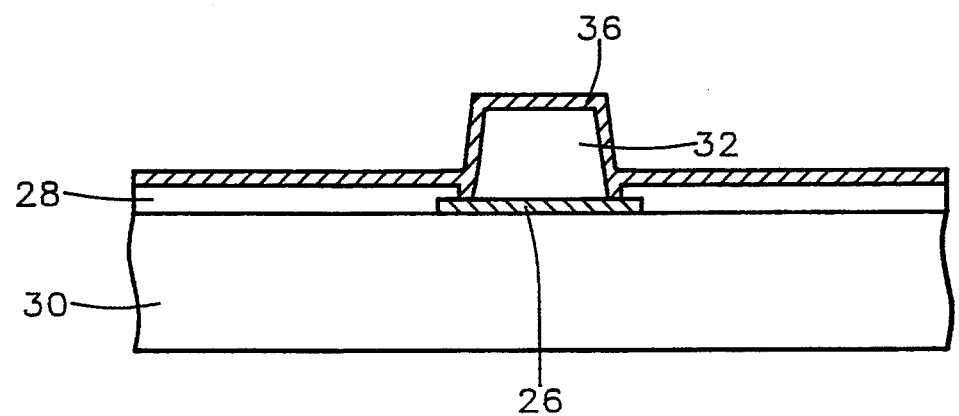
Figure 9E:
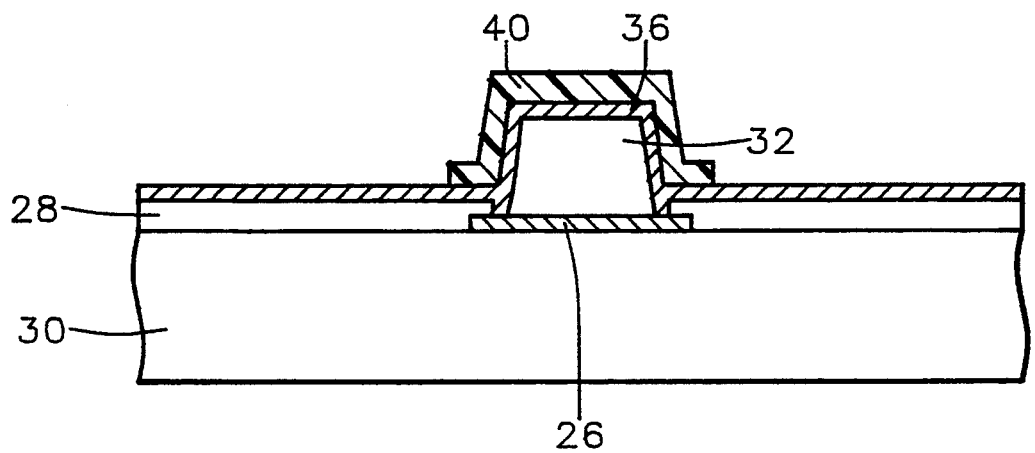
Figure 9F:
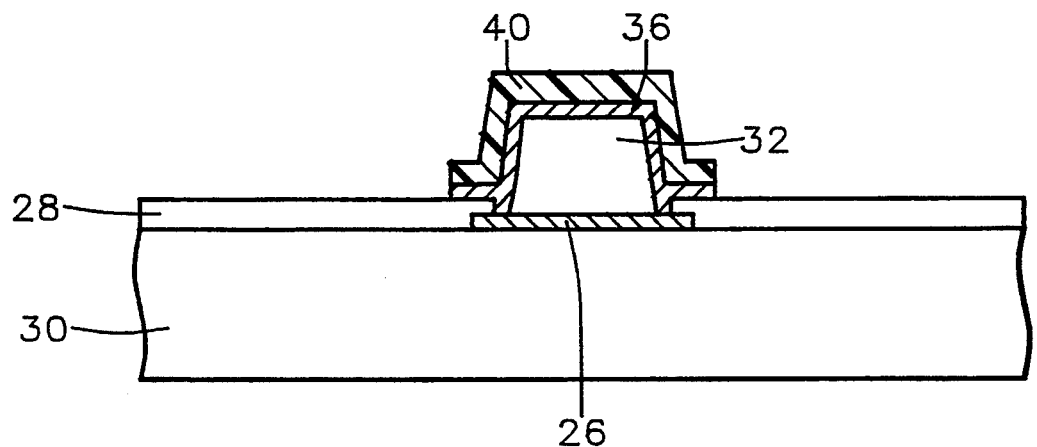
Figure 9G:
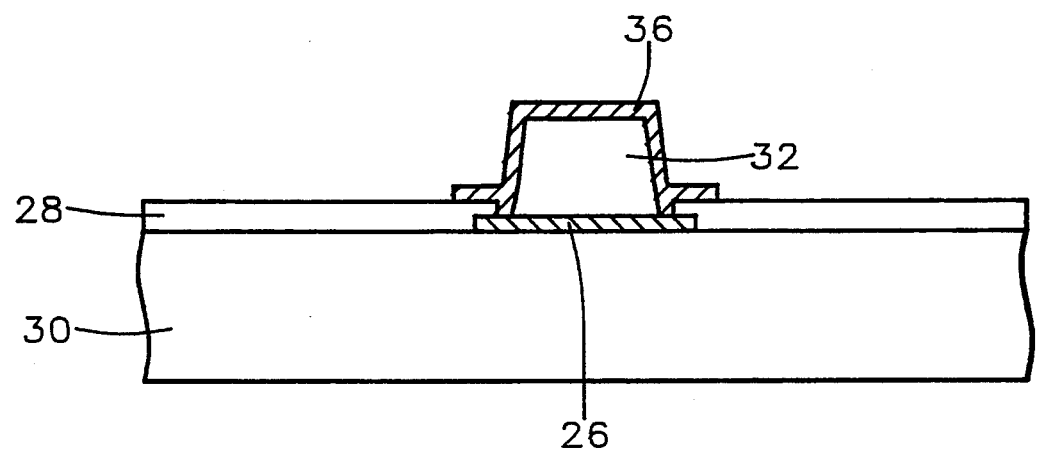

Another embodiment method is shown in FIGS. 9A through 9G. After the integrated circuit element or substrate 30 with input/output pads of about 90 microns diameter is etched and cleaned, FIG. 9A, a layer of photosensitive polymer 32 such as photosensitive polyamic acid polyimide, like PROBIMIDE 7020 produced by OCG Microelectronic Materials, Inc., Tempe, Ariz. with a thickness of between about 5 and 25 microns is formed on the surface integrated circuit element or substrate 30, FIG. 9B. The photosensitive polymer 32 is exposed and developed leaving polymer 32 only over the input/output pads, FIG. 9C. Patterning of polyimide films is described in Chapter 8 of POLYIMIDES edited by Wilson, Stenzenberger, and Hergenrother published by Blackie & Son Ltd. in 1990. Next a conductive metal layer 36 such as a composite of chrome/gold is deposited on the integrated circuit element or substrate 30 as shown in FIG. 9D and the process proceeds as described in the previous embodiment, FIGS. 9E, 9F, and 9G.

Figure 10A:
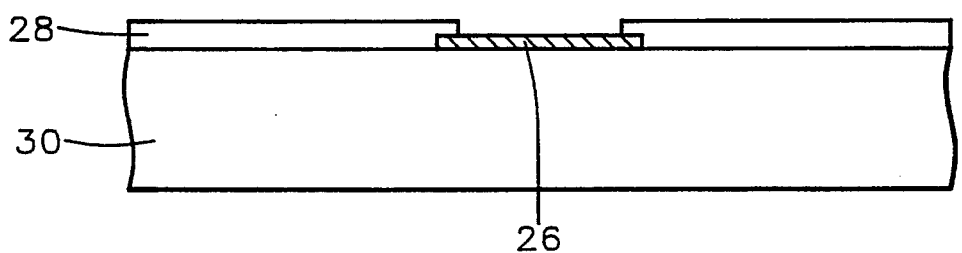
FIGS. 10A through 10H show cross sectional representations of the method for forming composite bumps with a base metal layer under the composite bump and on top of the input/output pad using photosensitive polymer to pattern the polymer layer and photoresist to pattern the metal layer.
Figure 10B:
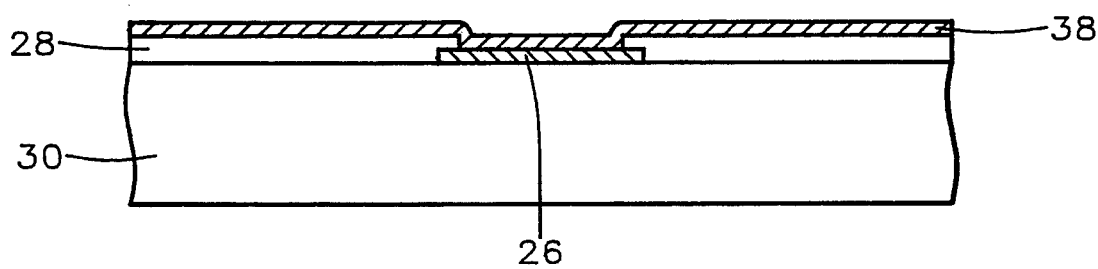
Figure 10C:
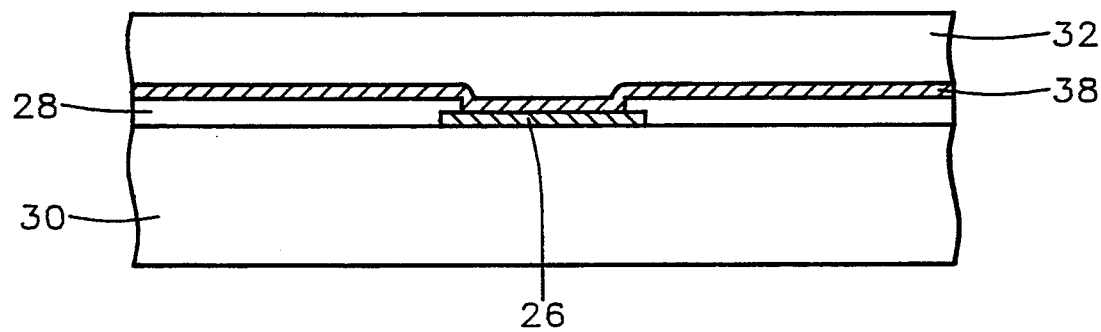
Figure 10D:
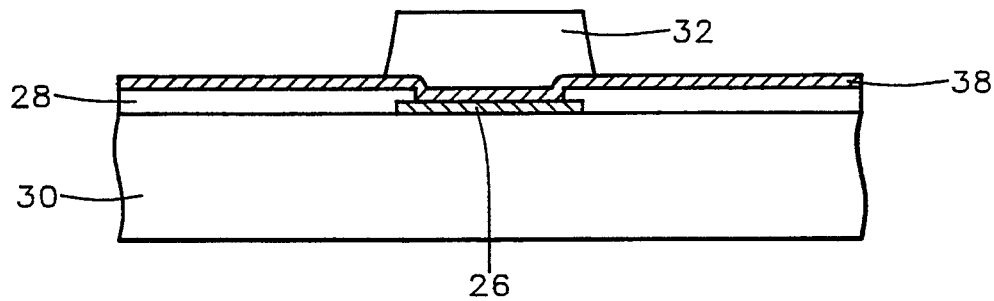
Figure 10E:
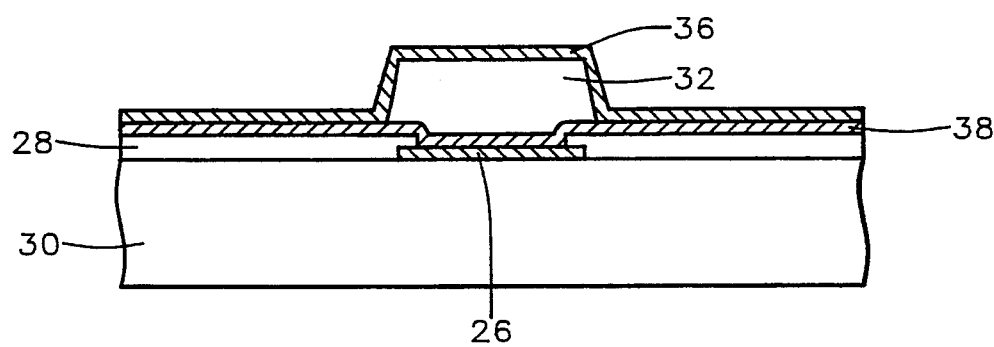
Figure 10F:
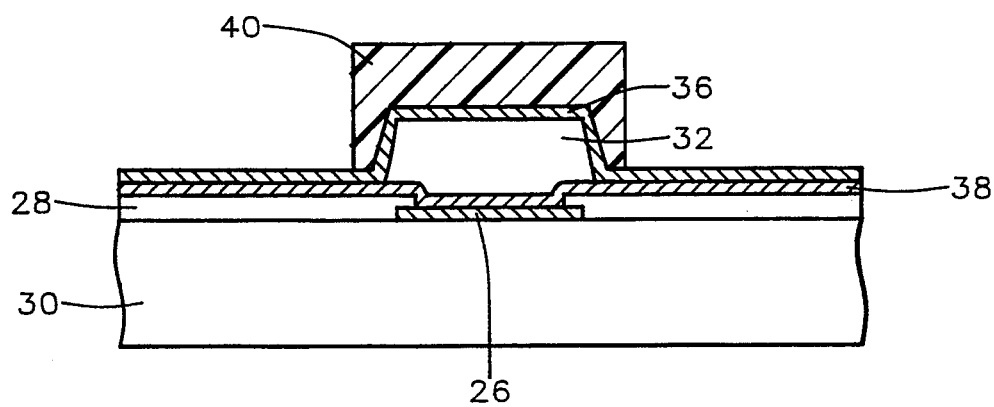
Figure 10G:
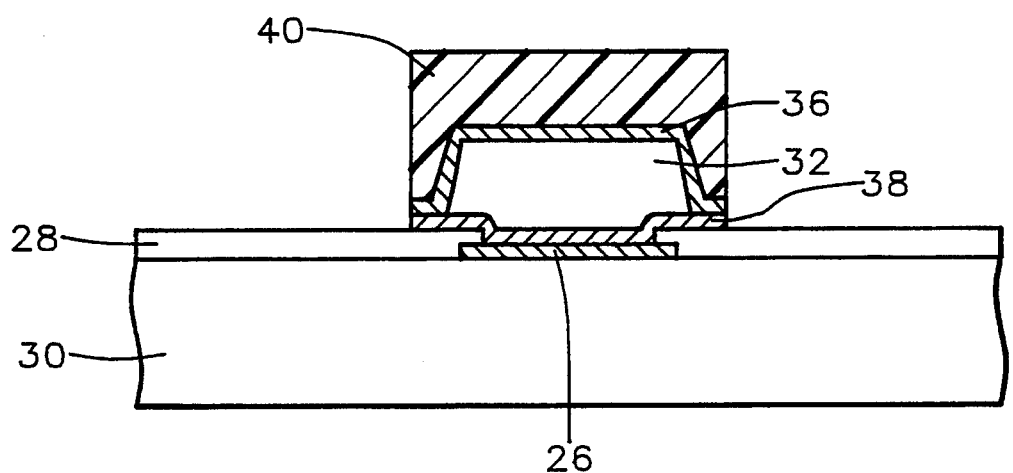
Figure 10H:
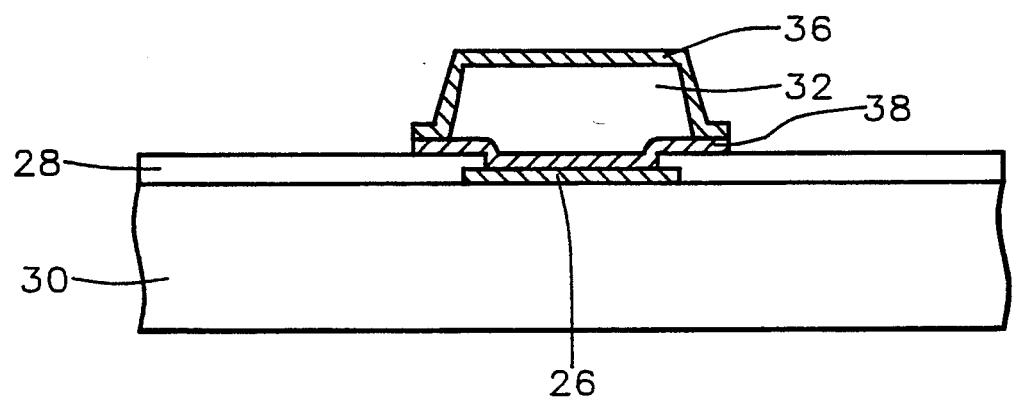

Another embodiment method is shown in FIGS. 10A through 10J. The integrated circuit element or substrate 30 with a passivation layer 28 and aluminum input/output pads 26 with a diameter of about 90 microns is etched and cleaned, as shown in FIG. 10A. Next, as shown in FIG. 10B, a layer of metal 38 such as aluminum is deposited on the integrated circuit element or substrate 30. The method then proceeds as described in the immediately preceding embodiment beginning with the formation of the layer of photosensitive polyamic acid polyimide 32 and continuing until the conductive metal coating 36 is etched, FIGS. 10C to 10G. The aluminum 38 is then etched using $H_3PO_4:CH_3COOH:HNO_3:H_2O$ (4:4:1:1) at room temperature at about 350 Angstroms/minute. As shown in FIG. 10H the photoresist is then stripped and the composite bump is formed.

Figure 11A:
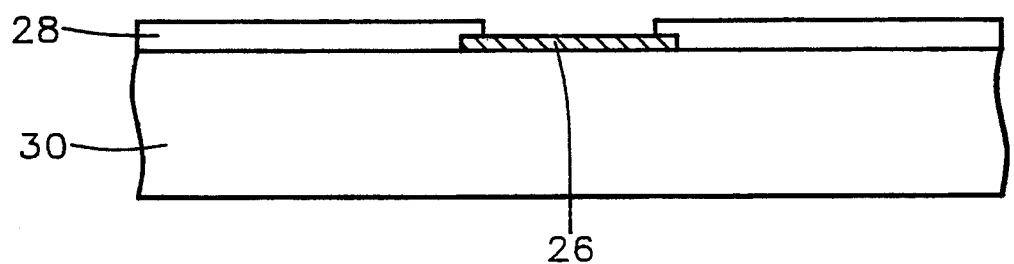
FIGS. 11A through 11e show cross sectional representations of the method for forming composite bumps using a lift off process.
Figure 11B:
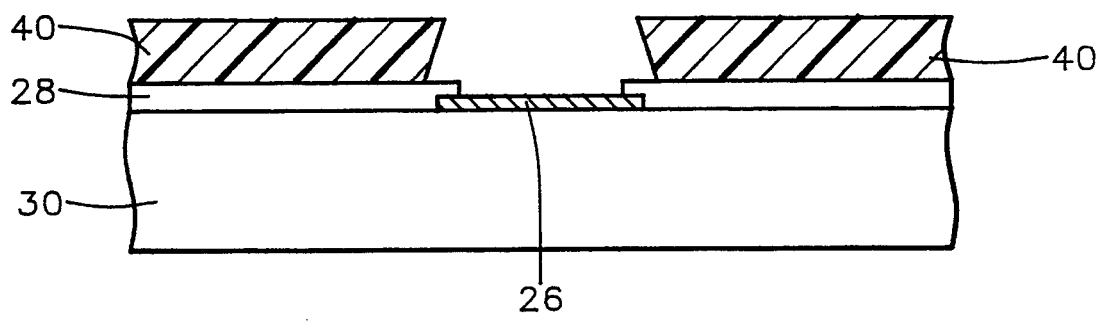
Figure 11C:
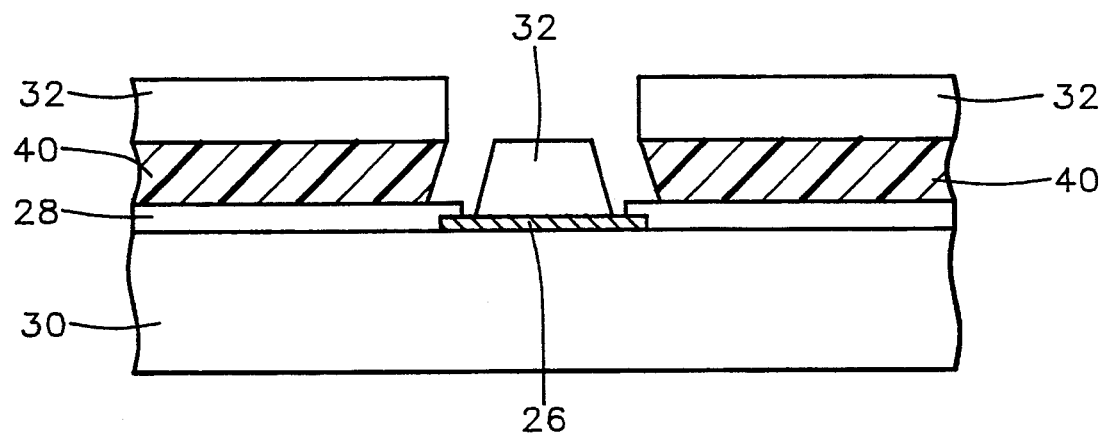
Figure 11D:
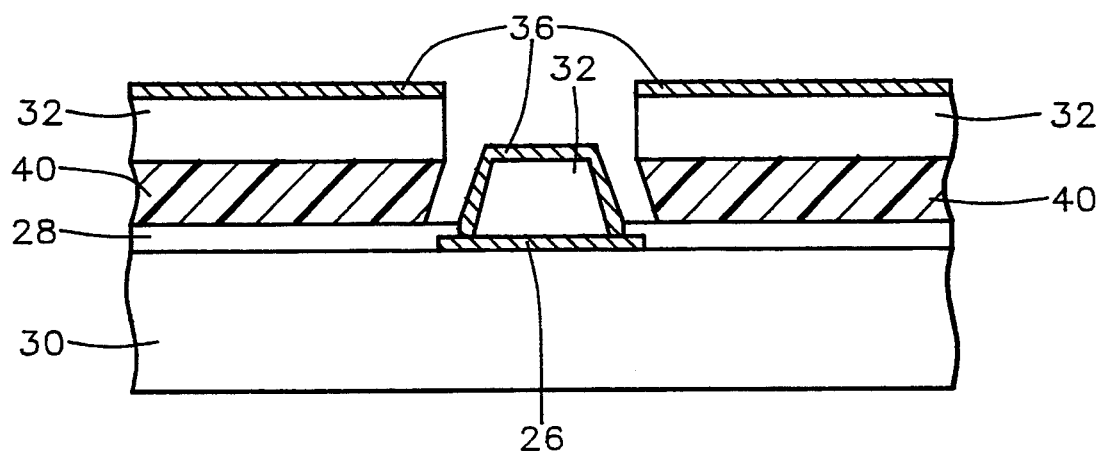
Figure 11E:
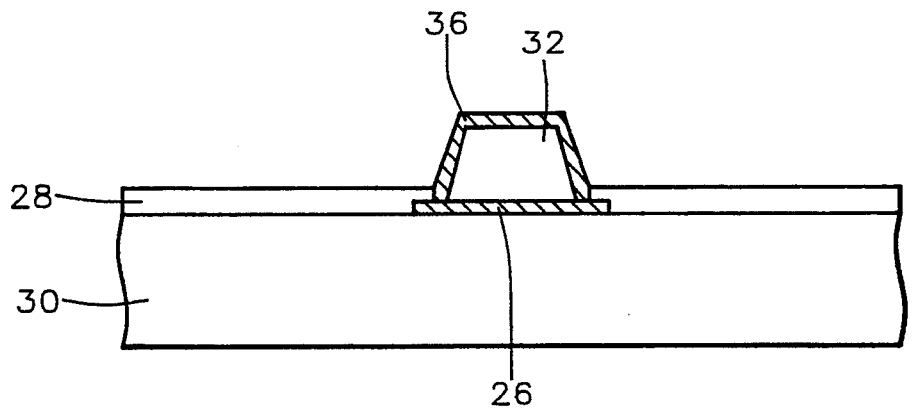

Another embodiment is shown in FIGS. 11A through 11E. First the integrated circuit element or substrate 30 with about 90 micron diameter input/output pads 26 is etched and cleaned, FIG. 11A. Next a photo resist mask 40 is formed leaving photoresist everywhere except over the input/output pads 26, FIG. 11B. Next a layer of polymer 32 is formed on the integrated circuit element of substrate 30 using vapor deposition polymerization. In a vacuum of about $3.75 \times 10^{-5}$ Torr 4,4 Oxy-Dianiline (ODA) is sprayed onto the integrated circuit element or wafer and heated to between about 80° C. and 160° C. While still at $3.75 \times 10^{-5}$ Torr pyromellitic dianhydride (PMDA) is sprayed onto the integrated circuit element or wafer and heated to between about 130° C. and 180° C. Vapor deposition polymerization is described by Takahashi et al in MACROMOLECULES, Vol. 24, No. 12, 1991, pp. 3543-3546. Next, as shown in FIG. 11D, a conductive metal layer 36 such as a composite of chrome/gold with chrome about 500 Angstroms thick and gold about 2000 Angstroms thick is deposited on the integrated circuit element or substrate 30. The coating 36 can also be the same metals described in the previous embodiments. Then the photoresist mask 40 is removed thereby removing the polymer and metal deposited on the photoresist leaving the composite bump, FIG. 11E.

Figure 12A:
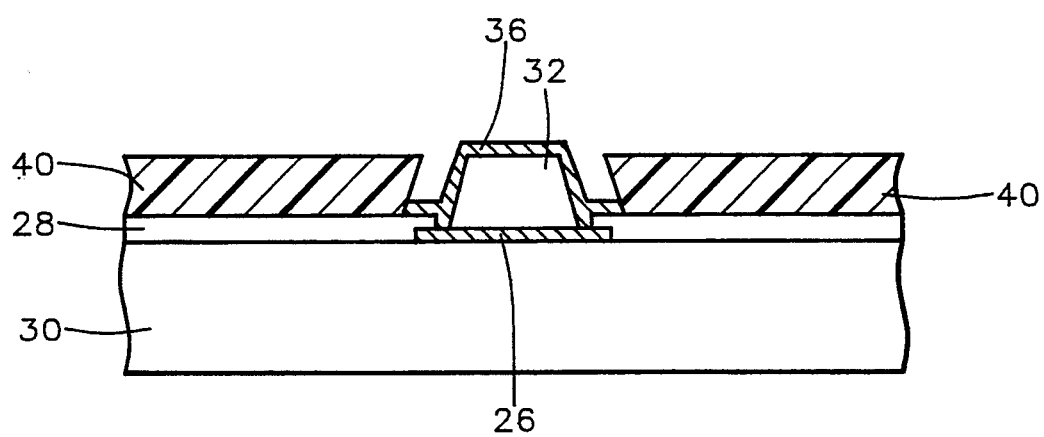
FIGS. 12A through 12C show cross sectional representations of the method for forming a solder layer on the composite bumps.
Figure 12B:
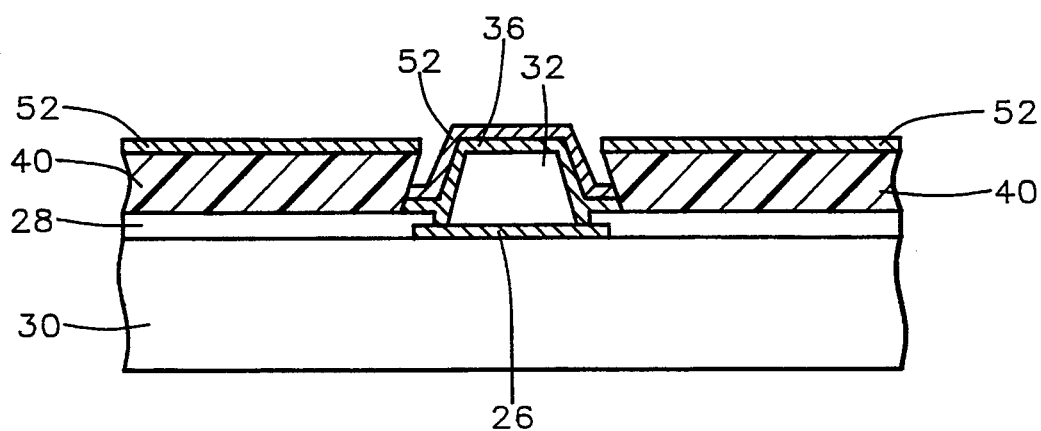
Figure 12C:
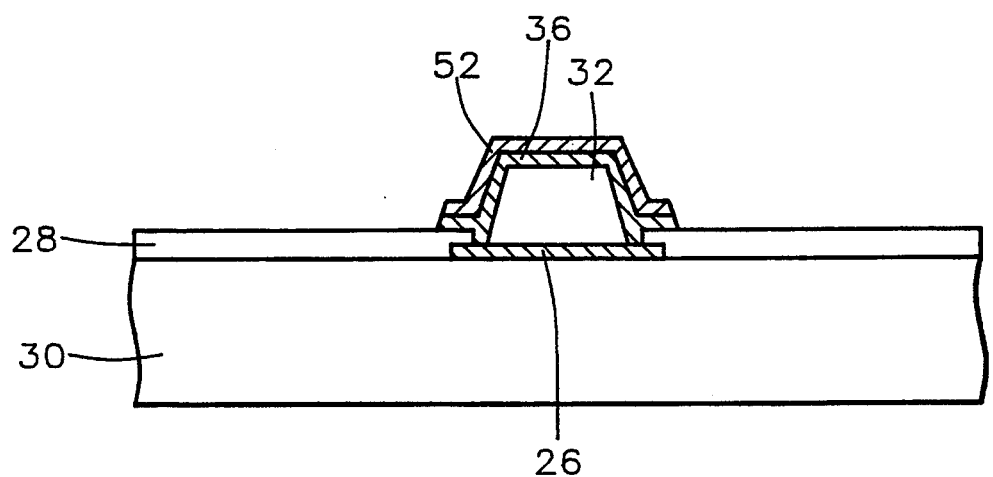

Another embodiment when a solder coating is desired on the composite bump is shown in FIGS. 12A through 12C. Composite bumps are formed on the integrated circuit element or substrate 30 using any of the preceding embodiment methods. In this case the preferred conductive metal coatings are chrome/copper/gold, chrome/nickel/gold, chrome/silver/gold, titanium/platinum/gold, or titanium/palladium/gold. A layer of photoresist 40 is then formed on the surface of the integrated circuit element or substrate 30 and patterned so that only the composite bumps are exposed, FIG. 12A. Solder 52, preferably 95% lead 5% tin is then deposited using chemical vapor deposition, FIG. 12B. Other percentages of lead and tin or solders using indium-tin or indium-gallium can also be used. The photoresist is then stripped thereby also removing the solder everywhere except on the composite bumps, FIG. 12C.

While the invention has been particularly shown and described with reference to the preferred embodiments thereof, it will be understood by those skilled in the art that various changes in form and details may be made without departing from the spirit and scope of the invention.

What is claimed is:

1. A method of forming composite bumps, comprising:
   providing an integrated circuit element or substrate with input/output pads;
   forming a polymer layer on the surface of said integrated circuit element or substrate;
   forming a first photoresist mask on said polymer layer directly over said input/output pads;
   etching said polymer not protected by said first photoresist mask;
   stripping said first photoresist mask;
   forming a conductive metal layer over the surface of said integrated circuit element or substrate;
   forming a second photoresist mask on said conductive metal layer directly over said input/output pads;
   etching said conductive metal not protected by said second photoresist mask; and
   stripping said second photoresist mask.

2. The method of claim 1 wherein said polymer is non photosensitive polyamic acid polyimide.

3. The method of claim 1, further comprising:
   forming a base metal layer on the integrated circuit element or substrate prior to forming said polymer layer; and
   etching said base metal not protected by said second photoresist mask, after etching said conductive metal, and before stripping said second photoresist mask.

4. The method of claim 3 wherein said base metal is aluminum.

5. The method of claim 1 wherein said conductive metal coating is a layer of chrome about 500 Angstroms thick and a layer of gold about 2000 Angstroms thick.

6. The method of claim 1 wherein said conductive metal coating includes an adhesion layer, a barrier layer, and a conductor layer.

7. The method of claim 1, further comprising:
   forming a third photoresist mask on said integrated circuit element or substrate, after the second photoresist mask has been stripped, covering the entire integrated circuit element or substrate surface except the area directly over the input/output pads;
   forming a layer of soldering metal on said third photoresist mask and said composite bumps; and
   stripping said third photoresist mask thereby leaving soldering metal only on the composite bumps.

8. The method of claim 7 wherein said soldering metal is 95% lead and 5% tin.

9. A method of forming composite bumps, comprising:
   providing an integrated circuit element or a substrate with input/output pads;
   forming a layer of photosensitive polymer on the surface of said integrated circuit element or substrate;
   exposing and developing a pattern on said photosensitive polymer so as to leave photosensitive polymer directly over said input/output pads only;

forming a conductive metal layer over the surface of said integrated circuit element or substrate;

forming a first photoresist mask on said conductive metal layer directly over said input/output pads;

etching said conductive metal layer not protected by said first photoresist mask; and stripping said first photoresist mask.

10. The method of claim 9 wherein said photosensitive polymer is photosensitive polyamic acid polyimide.

11. The method of claim 9, further comprising:

forming a base metal layer on the integrated circuit element or substrate prior to forming said polymer layer; and etching said base metal not protected by said first photoresist mask, after etching said conductive metal, and before stripping said first photoresist mask.

12. The method of claim 11 wherein said base metal is aluminum.

13. The method of claim 9 wherein said conductive metal coating is a layer of chrome about 500 Angstroms thick and a layer of gold about 2000 Angstroms thick.

14. The method of claim 9 wherein said conductive metal coating includes an adhesion layer, a barrier layer, and a conductor layer.

15. The method of claim 9, further comprising:

forming a second photoresist mask on said integrated circuit element or substrate, after the first photoresist mask has been stripped, covering the entire integrated circuit element or substrate surface except the area directly over the input/output pads;

forming a layer of soldering metal on said second photoresist mask and said composite bumps; and stripping said second photoresist mask thereby leaving only the soldering metal on the composite bumps.

16. The method of claim 15 wherein said soldering metal is 95% lead and 5% tin.

17. A method of forming composite bumps, comprising:

providing an integrated circuit element or substrate with input/output pads;

forming a first photoresist mask by lithography over said integrated circuit element or substrate surface except those areas directly over said input/output pads;

forming a layer of non photosensitive polymer over the surface of said integrated circuit element or substrate using vapor deposition polymerization;

forming a conductive metal layer over said integrated circuit element or substrate; and removing said first photoresist mask thereby removing said non photosensitive polymer and said conductive metal over said photoresist mask, leaving said non photosensitive polymer and said conductive metal over said input/output pads.

18. The method of claim 17 wherein said vapor deposition polymerization comprises:

providing a vacuum of about $3.75 \times 10^{-5}$ Torr;

spraying 4,4 Oxy-Dianiline onto said integrated circuit element or substrate;

heating said integrated circuit element or substrate to between about 80° C. and 160° C.;

spraying pyromellitic dianhydride onto said integrated circuit element or substrate; and heating said integrated circuit element or substrate to between about 130° C. and 180° C.

19. The method of claim 17 wherein said conductive metal coating is a layer of chrome about 500 Angstroms thick and a layer of gold about 2000 Angstroms thick.

20. The method of claim 17 wherein said conductive metal coating includes an adhesion layer, a barrier layer, and a conductor layer.

21. The method of claim 17, further comprising:

forming a second photoresist mask on said integrated circuit element or substrate by lithography, after the first photoresist mask has been stripped, covering the entire integrated circuit element or substrate surface except the area directly over the input/output pads;

forming a layer of soldering metal on said second photoresist mask and said composite bumps; and stripping said second photoresist mask thereby leaving only the soldering metal on the composite bumps.

22. The method of claim 21 wherein said soldering metal is 95% lead and 5% tin.

* * * * *